(12) United States Patent
Chang

(10) Patent No.: US 6,403,464 B1
(45) Date of Patent: Jun. 11, 2002

(54) METHOD TO REDUCE THE MOISTURE CONTENT IN AN ORGANIC LOW DIELECTRIC CONSTANT MATERIAL

(75) Inventor: Weng Chang, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/433,053

(22) Filed: Nov. 3, 1999

(51) Int. Cl.$^7$ .......................................... H01L 21/4763
(52) U.S. Cl. ..................... 438/623; 438/632; 438/685; 438/687; 438/688; 438/780; 438/781; 438/782; 438/787; 438/788; 438/789; 438/790; 438/798
(58) Field of Search ................................. 438/623, 632, 438/685, 687, 688, 780, 781, 782, 787, 788, 789, 790, 798

(56) References Cited

U.S. PATENT DOCUMENTS

| | | | |
|---|---|---|---|
| 5,270,267 A | 12/1993 | Ouellet | 437/231 |
| 5,567,658 A | 10/1996 | Wang et al. | 437/228 |
| 5,607,773 A | 3/1997 | Ahlburn et al. | 428/427 |
| 5,700,736 A | 12/1997 | Muroyama | 438/622 |
| 5,792,702 A | 8/1998 | Liang | 438/624 |
| 5,830,804 A | * 11/1998 | Cleeves et al. | 438/688 |
| 5,861,345 A | 1/1999 | Chou et al. | 438/763 |
| 5,866,945 A | 2/1999 | Chen et al. | 257/750 |
| 6,080,526 A | * 6/2000 | Yang et al. | 430/296 |
| 6,159,842 A | * 12/2000 | Chang et al. | 438/623 |

OTHER PUBLICATIONS

Swope et al., "Improvement of Adhesion Properties of Fluorinated Silica Glass Films by Nitrous Oxide Plasma Treatment", J. Electrochem Soc. vol. 144, Jul. 1997, pp. 2559–2563.

Yang et al., "Stability of Si–O–F low–k dielectrics: Attack by water molecules as function of near–neighbor Si–F bonding arrangements", J.Vac.Sci., Technol.A 16(3) Jun. 1998, pp.1525–1527.

* cited by examiner

Primary Examiner—John F. Niebling
Assistant Examiner—Lynne A. Gurley
(74) Attorney, Agent, or Firm—George O. Saile; Stephen B. Ackerman

(57) ABSTRACT

A method of forming an organic low k layer, for use as an interlevel dielectric layer in semiconductor integrated circuits, has been developed. An organic low k layer, such as a poly arylene ether layer, with a dielectric constant between about 2.6 to 2.8, is applied on an underlying metal interconnect pattern. The moisture contained in the as applied, organic low k layer, or the moisture absorbed by the organic low k layer, due to exposure to the environment, is then reduced via a high density plasma treatment, performed in a nitrogen ambient. The reduction in moisture can be accomplished, even when the organic low k layer had been exposed to the environment for a period of time as great as three months. The dielectric constant, of the organic low k layer, remains unchanged, as a result of the high density plasma treatment.

15 Claims, 1 Drawing Sheet

METHOD TO REDUCE THE MOISTURE CONTENT IN AN ORGANIC LOW DIELECTRIC CONSTANT MATERIAL

BACKGROUND OF THE INVENTION (1) Field of the Invention

The present invention relates to methods used to fabricate semiconductor devices, and more specifically to a method used to reduce the moisture content in an organic, low dielectric constant, (low k), layer, used to passivate metal interconnect structures.

(2) Description of Prior Art

The use of more conductive metal interconnect structures, comprised of low resistivity metals such as copper, has resulted in decreases in performance degrading RC delays, when compared to counterparts fabricated with more resistive aluminum, or tungsten interconnect structures. In addition the use of low dielectric constant, (low k), materials. have allowed the capacitance value of RC delays to be significantly reduced. Inorganic spin on glass, (SOG), layers, such as silicon oxyfluoride, ($Si_xOF_y$), or fluorinated silicate glass, (FSG), layers, with dielectric constants as low as 3.4, have been used to replace silicon oxide layers, exhibiting higher dielectric constants, and thus presented higher capacitance values, than FSG layers. Other low k materials, such as an organic layer of poly arylene ether, (PAE), featuring a dielectric constant between about 2.6 to 2.8, is also an attractive low k material, to be used in combination with copper interconnect structures, to result in the desired reductions in RC delay. However when using low k materials such as PAE, or other low k organic materials, the moisture absorbed by the low k organic material, if not reduced, can result in deleterious effects, such as loss of adhesion of the low k material, to overlying, and underlying layers, as well as corrosion of adjacent metal materials, such as copper interconnect structures.

This invention will describe a process for reducing the moisture content in organic low k materials, even if the low k organic material were exposed to the atmosphere for a period of time as great as three months. A high density plasma, (HDP), nitrogen treatment, or other nitrogen type treatments, are used to reduce the moisture in low k materials, without degrading the low k value of this material. The nitrogen treatment can be applied to PAE layers, as well as other organic, low k materials, such as FLARE, (Fluorinated polyARlene Ether polymers), HOSP, (Hydrido Organo Siloxane Polymer), LOSP, (Low Organic Siloxane Polymer). Prior art such as Chen et al, in U.S. Pat No. 5,866,945, as well as Ouellet, in U.S. Pat. No. 5,270,267, describe methods for treating SOG layers, in hydrogen, to restore dangling bonds, and to remove moisture from the SOG layer. However these prior arts do not described the key feature of this present invention in which an organic low k material, such as PAE, is treated in a nitrogen ambient, to reduce the moisture content in the organic low k material, even after the organic low k material had been exposed to the atmosphere for as long as three months.

SUMMARY OF THE INVENTION

It is an object of this invention to form a low k layer, overlying, and between, metal interconnect structures.

It is another object of this invention to use an organic material, with a dielectric constant below 2.8, for the low k layer.

It is still another object of this invention to perform a procedure, in a nitrogen ambient, to reduce the moisture content in the organic low k dielectric layer, even when the organic low k layer had been exposed to the atmosphere up to three months.

In accordance with the present invention a method of forming an organic low k layer, located overlying, and between, metal interconnect structures, is described. After formation of metal interconnect structures, overlying, and contacting, conductive regions, such as lower level metal interconnect structures, or active device regions, in a semiconductor structure, an organic layer, such as poly arylene ether, (PAE), with a dielectric constant of less than 2.8, is applied on the underlying metal interconnect structures. A nitrogen treatment, performed in either a high density plasma, (HDP), tool, or in conventional furnaces, is used to reduce the moisture content of the organic low k layer. The nitrogen treatment is effective in reducing the moisture content of organic low k layers, even for the case in which the organic low k layer had been exposed to the environment for a time period of up to three months.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
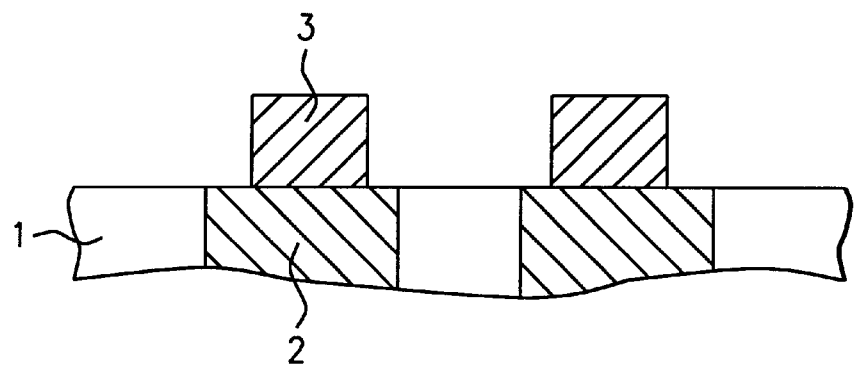
FIG. 1, which schematically, in cross-sectional style, shows metal structures prior to application of an organic low k layer.

The method of forming an organic low k layer, and of reducing the moisture content in the organic low k layer, will now be described in detail. FIG. 1, schematically shows conductive regions 2, embedded in insulator layer 1. Conductive regions 2, can be metal interconnect structures, comprised of a metal layer chosen from a group that includes an aluminum based material, an aluminum layer, or a tungsten layer. Conductive regions 2, can also be metal plug structures, again comprised of either tungsten or aluminum, overlying and contacting, an underlying, lower metal interconnect structure, (not shown in the drawings), or overlying and contacting an active device region, in a semiconductor substrate, (not shown in the drawings) Insulator layer 1, can be a silicon oxide layer, or a borophosphosilicate glass layer. Metal interconnect structures 3, comprised of a metal chosen from a group that includes copper, aluminum-copper, or tungsten, is formed overlying and contacting conductive regions 2. Metal interconnect structures 3, are formed via deposition of the metal layer, via plasma vapor deposition, (PVD), procedures, to a thickness between about 2000 to 12000 Angstroms, followed by patterning of the metal layer, via conventional photolithographic and reactive ion etching, (RIE), procedures, using $Cl_2$ or $SF_6$ as an etchant. The photoresist shape, used as a mask for definition of metal interconnect structures 3, is then removed via plasma oxygen ashing and careful wet cleans.

Figure 2:
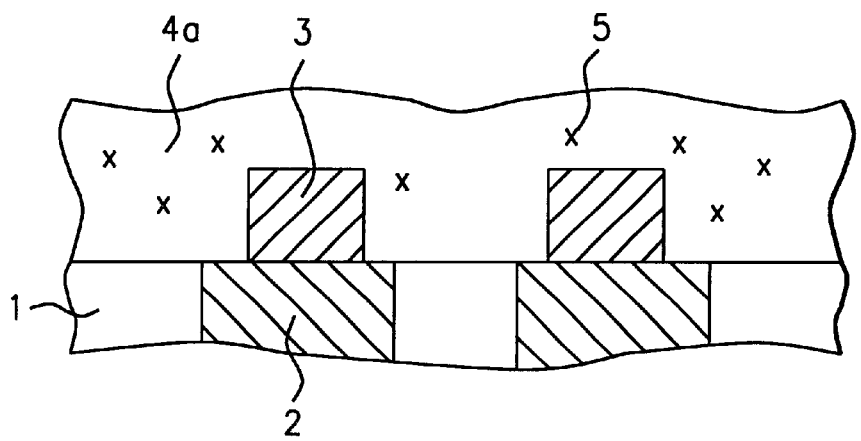
FIG. 2, which schematically, in cross-sectional style, shows an organic low k layer on underlying metal structures, comprised with included water molecules.

An organic low k layer 4a, is next applied, via spin on procedures, resulting in organic low k layer 4a, located on, and located between metal interconnect structures 3. To obtain the desired low k, needed for reduction in capacitance, and thus increases in performance, the low k organic layer is chosen from a groups that includes: PAE, (Poly Arylene Ether), FLARE, (Fluorinated Arylene Ether), HOSP, (Hydrido Organo Siloxane Polymer), and LOSP, (Low Organic Siloxane Polymer), all with a dielectric constant below 2.8. The organic low k layer 4a, is this case comprised of PAE, shown schematically in FIG. 2, is applied to a thickness between about 3000 to 10000 Angstroms, exhibiting a dielectric constant between about 2.6 to 2.8. A post application, curing procedure, performed at a temperature between about 350 to 450° C., in a nitrogen ambient, for a time between about 30 to 120 min, is used to remove solvents, incorporated in PAE layer 4a, during the application procedure. However there exists a propensity for organic low k layers, to absorb moisture from the environment. Water molecules 5, are shown schematically, throughout organic low k layer 4a. The level of water absorbed in PAE layer 4a, increases with the amount of time PAE layer 4a, is exposed to air. Therefore if a tool needed for a subsequent procedure, is down for maintenance or repair, or if samples, with exposed PAE surfaces are awaiting an engineering change, involving the creation of a new photolithographic design, the level of moisture absorbed into the exposed organic low k layer, can be great enough to adversely influence the yield and reliability of the devices using the organic low k layers. For example excess moisture in organic low k layer 4a, can result in a loss of adhesion between the organic low k layer, and underlying, or overlying materials. The excess moisture, in organic low k layer 4a, can also result in oxidation of, or corrosion of, metal interconnect structures 3.

Figure 3:
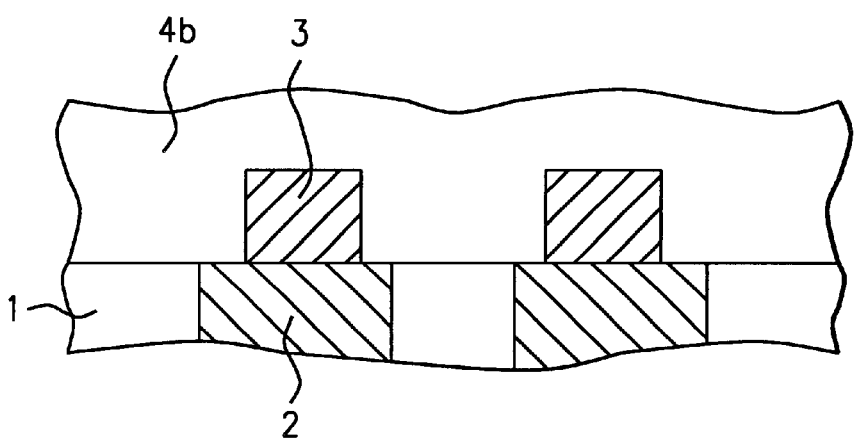
FIG. 3, which schematically, in cross-sectional style, shows an organic low k layer, with removed water molecules after a high density plasma nitrogen treatment.

A method of removing water molecules 5, or reducing the moisture content of organic low k layer 4a, comprised in this case with PAE, is next addressed. A nitrogen treatment, performed using either high density plasma, (HDP), procedures, or performed using other type procedures in a nitrogen ambient, are performed at a temperature between about 350 to 450° C., for a time between about 0.5 to 2.0 min, using a power between about 250 to 1000 watts, and a pressure between about 50 to 200 mtorr. The HDP treatment removes water molecules from organic low k layer 4a, resulting in organic low k layer 4b, without the absorbed water molecules 5. This is schematically shown in FIG. 3. The extended nitrogen treatment does not change the dielectric constant, for the organic low k layer, as evidenced by the dielectric constant of PAE layer 4b, still between about 2.6 to 2.8, after a 2 min. treatment, HDP nitrogen treatment. This nitrogen treatment is successful in reducing the moisture content, in organic low k layers, even after the organic low k layer was left exposed to the environment for a period of time as long as three months.

While this invention has been particularly shown and described with reference to, the preferred embodiments thereof, it will be understood by those skilled in the art that various changes in form and details may be made without departing from the spirit and scope of this invention.

What is claimed is:

1. A method of forming an organic low dielectric constant, (low k), layer, on a semiconductor substrate, featuring a final nitrogen procedure used to remove water from said organic low k layer which had previously experienced an initial curing procedure performed between about 0 to 3 months prior to said final nitrogen procedure, comprising the steps of:

providing underlying metal interconnect structures;

applying said organic low k layer on said underlying metal interconnect structures, and between said underlying metal interconnect structures;

performing said initial curing procedure to said organic low k layer; and performing said final nitrogen procedure to remove water from said organic low k layer.

2. The method of claim 1, wherein said metal interconnect structures are comprised of a metal chosen from a group that includes, copper, aluminum-copper, or tungsten.

3. The method of claim 1, wherein said organic low k layer is comprised of a poly arylene ether layer, obtained via spin on procedures, to a thickness between about 3000 to 10000 Angstroms, and with a dielectric constant between about 2.6 to 2.8.

4. The method of claim 1, wherein said organic low k layer can be comprised of a material chosen from a group that includes, FLARE, (FLuorinated polyARylene Ether), HOSP, (Hydrido Organo Siloxane Polymer), or LOSP, (Low Organic Siloxane Polymer), obtained via spin on procedures, at a thickness between about 3000 to 10000 Angstroms, and with a dielectric constant between about 2.6 to 2.8.

5. The method of claim 1, wherein said initial curing procedure performed on said organic low k layer, is performed at a temperature between about 350 to 450° C., in a nitrogen ambient, for a time between about 30 to 120 min.

6. The method of claim 1, wherein said final nitrogen procedure, used to remove water molecules from said organic low k layer, is performed using a high density plasma procedure, at a temperature between about 350 to 450° C., at a power between about 250 to 1000 watts, at a pressure between about 50 to 200 mtorr, and for a time between about 0.5 to 2.0 min.

7. The method of claim 1, wherein the dielectric constant of said organic low k layer, after subjection to said nitrogen treatment, is between about 2.6 to 2.8.

8. A method of removing water from an organic low k layer via a combination of nitrogen treatments, featuring an initial nitrogen curing procedure performed after application of said first organic low k layer, and a final nitrogen procedure which can be performed between 0 to 3 months after said initial nitrogen curing procedure and still remove absorbed water from previously treated, said organic low k layer, comprising the steps of:

providing underlying metal interconnect structures, overlying, and contacting, underlying conductive regions;

applying a first organic low k layer, on said underlying metal interconnect structures, and between said underlying metal interconnect structures;

performing said initial nitrogen curing procedure, to remove solvents from said first organic low k layer; and performing said final nitrogen procedure, in a high density plasma tool, to remove said water absorbed in said first organic low k layer, during application of said first organic low k layer, and for water absorbed by said first organic low k layer in a time period for as long as three months after said initial nitrogen curing procedure, resulting in a second organic low k layer.

9. The method of claim 8, wherein said metal interconnect structures are comprised of a metal chosen from a group that includes copper, aluminum-copper, or tungsten.

10. The method of claim 8, wherein said first organic low k layer is a poly arylene ether layer, obtained via spin on procedures, to a thickness between about 3000 to 10000 Angstroms, with a dielectric constant between about 2.6 to 2.7.

11. The method of claim 8, wherein said first organic low k layer can be comprised of a material chosen from a group that includes FLARE, (Fluorinated polyARylene Ether), HOSP, (Hydrido Organo Siloxane Polymer), and LOSP, (Low Organic Siloxane Polymer).

12. The method of claim 8, wherein said first organic low k layer is an organic low k layer, comprised with water molecules in the organic low k layer.

13. The method of claim 8, wherein said initial nitrogen curing procedure, performed to said first organic low k layer, is performed at a temperature between about 350 to 450° C., for a time between about 30 to 120 min, in a nitrogen ambient.

14. The method of claim 8, wherein said final nitrogen procedure is a high density plasma treatment, performed to said first organic low k layer, in a high density plasma tool, in a nitrogen ambient, at a temperature between about 350 to 450° C., at a power between about 250 to 1000 watts, at a pressure between about 50 to 200 mtorr, for a time between about 0.5 to 2.0 min.

15. The method of claim 8, wherein said second organic low k layer is a poly arylene ether layer, with a lower water content then said first organic low k layer, and with a dielectric constant between about 2.6 to 2.8.

* * * * *